United States Patent
Twynam

(10) Patent No.: US 8,017,977 B2
(45) Date of Patent: Sep. 13, 2011

(54) FIELD EFFECT TRANSISTOR HAVING RECESSED GATE IN COMPOSITIONAL GRADED LAYER

(75) Inventor: John Twynam, Yamatokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 261 days.

(21) Appl. No.: 11/940,157

(22) Filed: Nov. 14, 2007

(65) Prior Publication Data

US 2008/0308843 A1   Dec. 18, 2008

(30) Foreign Application Priority Data

Nov. 15, 2006   (JP) .................................. 2006-309095

(51) Int. Cl.
*H01L 29/66*   (2006.01)
*H01L 21/02*   (2006.01)
*H01L 29/47*   (2006.01)

(52) U.S. Cl. ........ 257/191; 257/192; 257/194; 257/196; 257/472; 257/475; 257/E29.246

(58) Field of Classification Search ................. 257/191
See application file for complete search history.

(56) References Cited

U.S. PATENT DOCUMENTS

| | | | |
|---|---|---|---|
| 6,064,082 A * | 5/2000 | Kawai et al. ................. | 257/192 |
| 6,465,814 B2 * | 10/2002 | Kasahara et al. ............ | 257/192 |
| 2006/0108606 A1 * | 5/2006 | Saxler et al. ................. | 257/200 |
| 2006/0255341 A1 * | 11/2006 | Pinnington et al. ............ | 257/79 |
| 2007/0045670 A1 * | 3/2007 | Kuraguchi ..................... | 257/249 |

OTHER PUBLICATIONS

Takeshi Kawasaki et al., Extended Abstracts of the 2005 International Conference on Solid State Devices and Materials, Kobe, 2005, pp. 206-207.

* cited by examiner

*Primary Examiner* — N Drew Richards
*Assistant Examiner* — Michael Jung
(74) *Attorney, Agent, or Firm* — Birch, Stewart, Kolasch & Birch, LLP

(57) ABSTRACT

A GaN heterojunction FET has an $Al_xGa_{1-x}N$ first graded layer and an $Al_yGa_{1-y}N$ second graded layer, which are formed sequentially on a channel layer. The Al mole fraction x of the first graded layer decreases linearly from, for example, 0.2 at an interface of the first graded layer with the channel layer to 0.1 at an interface thereof with the second graded layer. The Al mole fraction y of the second graded layer increases from, for example, 0.1 at an interface of the second graded layer with the first graded layer to 0.35 at a surface located on the opposite side from the first graded layer. Because the intrinsic polarization of AlGaN depends on the Al mole fraction, fixed negative charge is generated in the $Al_xGa_{1-x}N$ first graded layer, and fixed positive charge is generated in the $Al_yGa_{1-y}N$ second graded layer.

8 Claims, 3 Drawing Sheets

FIELD EFFECT TRANSISTOR HAVING RECESSED GATE IN COMPOSITIONAL GRADED LAYER

CROSS-REFERENCE TO RELATED APPLICATIONS

This nonprovisional application claims priority under 35 U.S.C. §119(a) on Patent Application No. 2006-309095 filed in Japan on Nov. 15, 2006, the entire contents of which are hereby incorporated by reference.

BACKGROUND OF THE INVENTION

The present invention relates to field effect transistors (FETs) and more particularly to heterostructure field effect transistors (HFETs) such as, for example, GaN HFETs.

FIG. 5 schematically shows a cross section of a conventional GaN power HFET fabricated in accordance with the disclosure of a literature entitled "Normally-off AlGaN/GaN HEMT with Recessed Gate for High Power Applications" (Extended Abstracts of the 2005 International Conference on Solid State Devices and Materials, Kobe, pp. 206-207). In the GaN power HFET, a buffer layer 2002, a channel layer 2003 composed of undoped GaN and a layer 2004 composed of $Al_{0.25}Ga_{0.75}N$ are stacked on a sapphire substrate 2001 in this order. A Ti/Al source ohmic contact 2006 and a Ti/Al drain ohmic contact 2008 are formed on the $Al_{0.25}Ga_{0.75}N$ layer 2004. The $Al_{0.25}Ga_{0.75}N$ layer 2004 has a recess 2010 formed by the process of etching, and a Schottky gate electrode 2007 is formed in the recess 2010.

The GaN power HFET is of the n-channel "normally off" type, which means that the gate threshold voltage is equal to or greater than 0 V.

The threshold voltage of the conventional HFET described above depends on the thickness of the AlGaN layer 2004 remaining between the Schottky gate electrode 2007 and the undoped GaN channel layer 2003.

The thickness of the AlGaN layer 2004 remaining beneath the Schottky gate electrode 2007 varies due to recess etching because the etching rate is difficult to control accurately. Therefore, disadvantageously, there is some variation in the threshold voltage between different devices at different positions on the same wafer and also between different parts of an individual FET especially when the FET has a broad area.

SUMMARY OF THE INVENTION

The present invention provides an FET capable of suppressing the variation in the threshold voltage.

A field effect transistor ("FET") according to an aspect of the present invention includes:
a buffer layer composed of a semiconductor formed on a substrate;
a channel layer composed of a semiconductor formed on the buffer layer;
a first graded layer formed on the channel layer and composed of $Al_xGa_{1-x}N$ whose Al mole fraction x is continuously changed in a layer thickness direction;
a second graded layer formed on the first graded layer and composed of $Al_yGa_{1-y}N$ whose Al mole fraction y is continuously changed in a layer thickness direction;
a source ohmic electrode formed on the first or second graded layer;
a drain ohmic electrode formed on the first or second graded layer; and
a gate Schottky electrode formed on the first or second graded layer, wherein
the Al mole fraction x of the first graded layer decreases from an interface of the first graded layer with the channel layer toward an interface of the first graded layer with the second graded layer, and
the Al mole fraction y of the second graded layer increases from an interface of the second graded layer with the first graded layer toward a surface of the second graded layer on an opposite side from the first graded layer.

In the FET of the present invention, a negative fixed charge is generated in the first graded layer by the intrinsic polarization that changes depending on the Al mole fraction x. The negative fixed charge has the effect of depleting the electric charge of the channel layer. On the other hand, a positive fixed charge is generated in the second graded layer by the intrinsic polarization that varies depending on the Al mole fraction y. The positive fixed charge has the effect of canceling or correcting the depleting effect of the negative fixed charge in the first graded layer.

With this arrangement, the change in the threshold voltage relative to the change in the thickness of the first and second graded layers beneath the gate Schottky electrode can be suppressed in comparison with the case where the Al mole fractions of the first and second graded layers are uniform.

In one embodiment, the Al mole fraction y of the second graded layer at the surface on the opposite side from the first graded layer has a value greater than a value of the Al mole fraction x of the first graded layer at the interface with the channel layer. For example, the Al mole fraction x of the first graded layer may be 0.2 at the interface with the channel layer and 0.1 at the interface with the second graded layer, and the Al mole fraction x may linearly decrease from the interface with the channel layer toward the interface with the second graded layer. And, the Al mole fraction y of the second graded layer may be 0.1 at the interface with the first graded layer and 0.35 at the surface located on the side opposite from the first graded layer, and the Al mole fraction y may increase linearly from the interface with the first graded layer toward the surface located on the side opposite from the first graded layer.

With this arrangement, the variation in the threshold voltage can be well suppressed In one embodiment, the gate Schottky electrode is formed in a recess in the second graded layer or in a recess in the second and first graded layers.

In the FET of this embodiment, it is easy to achieve the normally-off operation by virtue of the formation of the recess.

In one embodiment, the FET has a threshold voltage that is equal to or greater than 0 V.

In the embodiment, the FET achieves the normally off operation.

In one embodiment, the first and second graded layers have hexagonal crystal structure.

In the embodiment, the FET achieves the normally off operation.

In one embodiment, the first and second graded layers have a c-plane Ga face type orientation.

In the embodiment, the FET achieves the normally off operation.

Also, an FET according to an embodiment includes:
a buffer layer composed of a semiconductor formed on a substrate;
a channel layer composed of a semiconductor formed on the buffer layer;

a first graded layer which is formed on the channel layer and whose composition is continuously changed in a layer thickness direction such that the first graded layer has a positive fixed charge;

a second graded layer which is formed on the first graded layer and whose composition is continuously changed in a layer thickness direction such that the second graded layer has a negative fixed charge;

a source ohmic electrode formed on the first or second graded layer;

a drain ohmic electrode formed on the first or second graded layer; and a gate Schottky electrode formed on the first or second graded layer.

In the FET of the present embodiment, the negative fixed charge contained in the first graded layer has the effect of depleting the electric charge of the channel layer. On the other hand, the positive fixed charge contained in the second graded layer has the effect of correcting or canceling the depleting effect of the negative fixed charge in the first graded layer. With this arrangement, the change in the threshold voltage relative to the changes in the thickness of the first and second graded layers beneath the gate Schottky electrode can be suppressed.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

Figure 1:
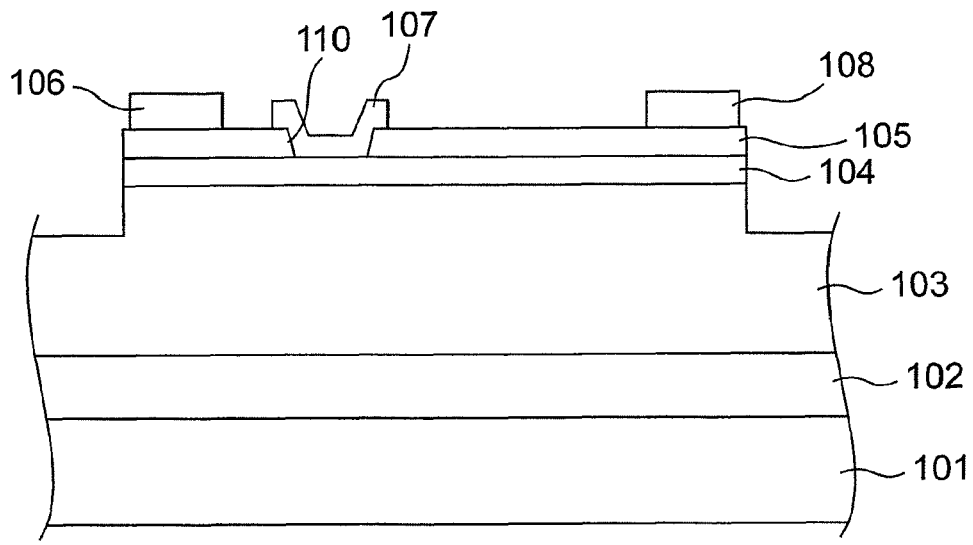
FIG. 1 is a sectional view showing an HFET according to an embodiment of the FET of the present invention.

The present invention will now be described in detail below by the embodiments shown in the drawings.

FIG. 1 shows a cross section of an embodiment of the FET of the present invention. In the embodiment, an AlN buffer layer 102, a channel layer 103 composed of undoped GaN, a first graded layer 104 composed of $Al_xGa_{1-x}N$ (0<x<1) and a second graded layer 105 composed of $Al_yGa_{1-y}N$ (0<y<1) are stacked in this order on a silicon substrate 101.

A source ohmic electrode 106 composed of Ti/Al lamination and a drain ohmic electrode 108 composed of Ti/Al lamination are formed on the second graded layer 105. Moreover, a recess 110 that reaches the surface of the first graded layer 104 is formed by etching in the second graded layer 105, and a Schottky gate electrode 107 composed of WN/Au lamination is formed in the recess 110. The Schottky gate electrode 107 covers the whole sides of the recess 110 including the surface of the first graded layer 104 exposed at the recess 110.

In the present embodiment, the layer thickness of the undoped GaN channel layer 103 is set to 2 μm. The Al mole fraction x of the first graded layer 104 composed of $Al_xGa_{1-x}N$ formed on the channel layer 103 is continuously changed in the layer thickness direction and decreases linearly (at a constant rate of change) from an interface of the first graded layer 104 with the channel layer 103 toward an interface thereof with the second graded layer 105. The Al mole fraction x of the first graded layer 104 is 0.2 at the interface with the channel layer 103 and 0.1 at the interface with the second graded layer 105. The layer thickness of the first graded layer 104 is 100 Å.

The Al mole fraction y of the second graded layer 105 composed of $Al_yGa_{1-y}N$ formed on the first graded layer 104 is continuously changed in the layer thickness direction, and the Al mole fraction y is increased linearly (at a constant rate of change) from the interface with the first graded layer 104 toward a surface located on a side opposite from the first graded layer 104. The Al mole fraction y of the second graded layer 105 is 0.1 at the interface with the first graded layer 104 and 0.35 on the surface located on the side opposite from the first graded layer 104. The layer thickness of the second graded layer 105 is 100 Å.

According to the present embodiment, an n-channel "normally off" GaN heterojunction FET having a threshold voltage of equal to or greater than 0 V was achieved.

More in detail, in the present embodiment, the $Al_xGa_{1-x}N$ first graded layer 104 and the $Al_yGa_{1-y}N$ second graded layer 105 have intrinsic polarization, which varies depending on the Al mole fraction x, y. The linear variation, or grading of the Al mole fractions causes the graded layers to contain fixed charge. A fixed charge density ρ in the graded layers is given by the following formula (1).

$$\rho = -8.97 \times 10^{-6} \cdot \partial x/\partial z (C\ cm^{-3}) \quad (1)$$

where X represents the Al mole fraction, and Z represents the distance in the direction of layer thickness (vertical direction) from the surface of the semiconductor channel layer 103.

With the formula (1), the fixed charge density of the first graded layer 104 is about −0.897 (C cm$^{-3}$). The fixed electric charge of the first graded layer 104 has the effect of depleting the electric charge in the channel of the channel layer 103. On the other hand, the fixed charge density of the second graded layer 105 is about +2.243 (C cm$^{-3}$). This fixed electric charge of the second graded layer 105 has the effect of canceling, or correcting the channel depleting effect of the first graded layer 104 as described later.

Figure 2:
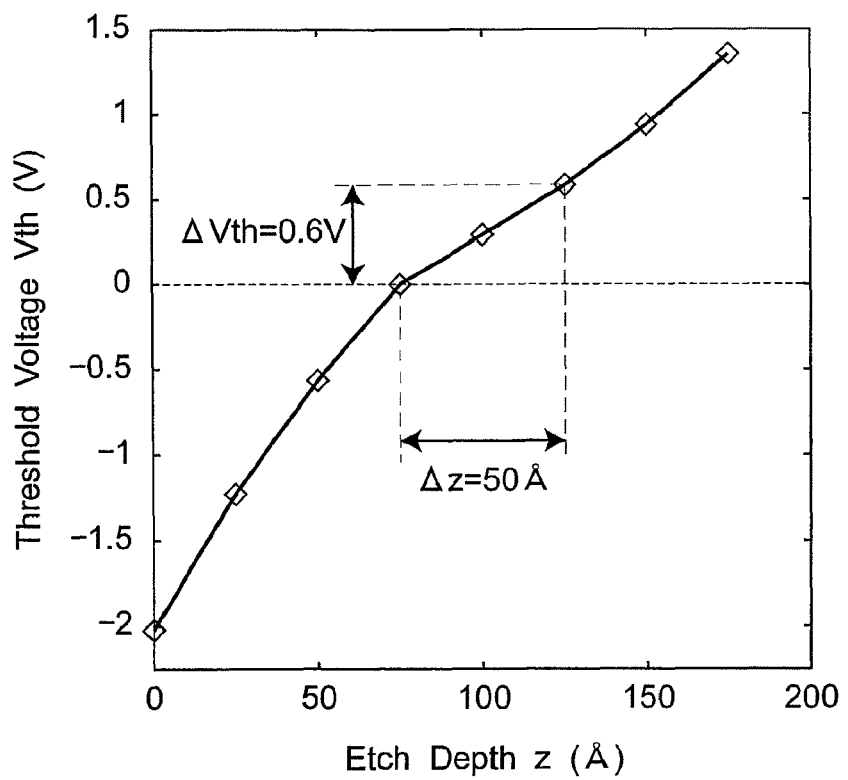
FIG. 2 is a characteristic graph showing a relation between the threshold voltage and the recess etch depth in the embodiment.

With the structures of the first and second graded layers 104, 105 of the present embodiment, a change in the threshold voltage due to a change in the etch depth is greater when the recess etching stops within the second graded layer 105 than when the recess etching advances into the first graded layer 104. FIG. 2 shows a relationship between the etch depth z (Å) and the threshold voltage Vth (V) resulting from the simulation on the HFETs according to the embodiment which were different only in the etch depth z (i.e., the depth of the recess 110). The etch depth z (Å) is a depth measured from the surface of the second graded layer 105. Referring to FIG. 2, it can be understood that ΔVth/Δz (the amount of change in the threshold voltage versus the amount of change in the etch depth) is larger in a region where the etch depth z is smaller than 75 Å than a region where the etch depth z ranges from 75 Å to 125 Å.

For fabrication of normally-off n-channel HFETs as in the present embodiment, it is required to manufacture the HFET such that all devices (n-channel HFETs) on the wafer have a threshold voltage of greater than or equal to 0V. For example, in the HFET that exhibits the threshold voltage characteristic of FIG. 2, recess etching to a depth of 75 Å is necessary for providing the normally-off structure. Therefore, for the case when the variation in recess etch depth is 50 Å x, assuming that a minimum etch depth is 75 Å, then the etch depth will vary from the minimum value of 75 Å to a maximum value of 125 Å for this example. This will result in achievement of a narrow distribution of threshold voltages ranging from 0 V to +0.6 V, as illustrated in FIG. 2.

Figure 5:
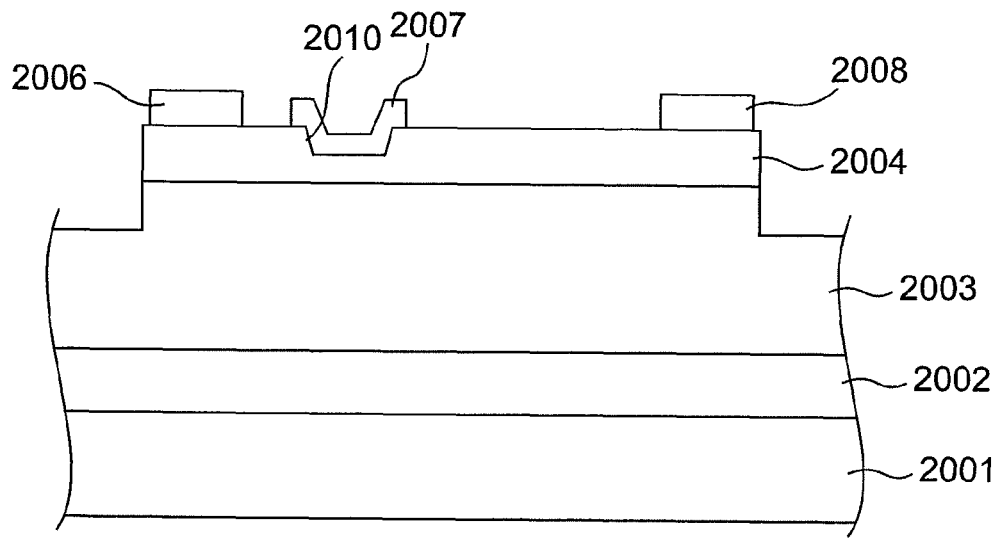
FIG. 5 is a sectional view showing a conventional HFET.
Figure 6:
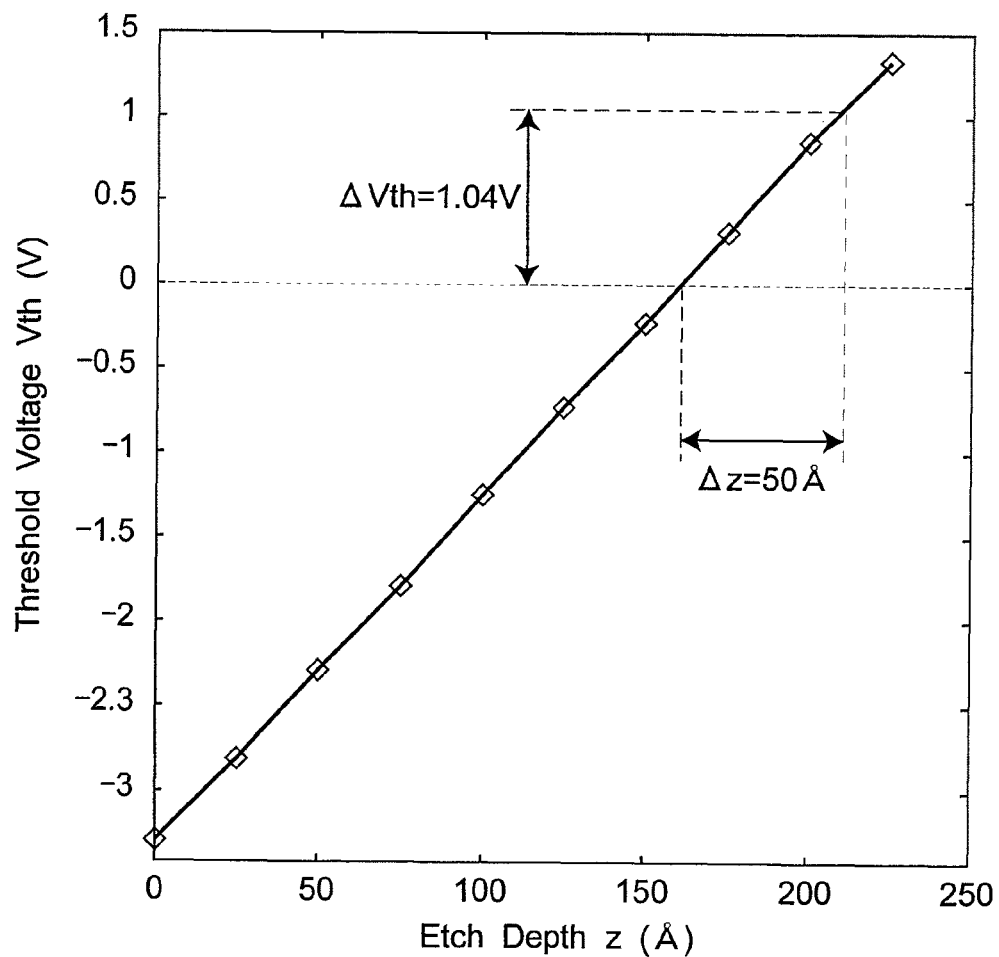
FIG. 6 is a characteristic graph showing the relation between the threshold voltage and the recess etch depth in the conventional example.

As a counterexample, FIG. 6 shows simulation results indicating the relationship between the etch depth z (Å) of the recess 2010 formed in the $Al_{0.25}Ga_{0.75}N$ layer 2004 and the threshold voltage Vth (V) for the conventional example shown in FIG. 5. As shown in FIG. 6, $\Delta Vth/\Delta z$ has a roughly constant value in the conventional example. Thus, in order to provide a complete normally-off structure when the etch depth has a variation of 50 Å, the depth of the recess 2010 will vary from 154 Å to 204 Å. This depth distribution ranging from 154 Å to 204 Å will result in a distribution of threshold voltages Vth ranging from 0 V to +1.04 V, which is wider than in the present embodiment.

It can be understood from above that the HFET of the present embodiment has a smaller dependence of the threshold voltage on the recess depth than the conventional HFET. Therefore, the HFET of the present embodiment provides an improved yield and is easier to manufacture than the conventional HFET.

Moreover, in the HFET of the present embodiment, the fixed charge of the second graded layer 105 its non-recessed regions has the effect of canceling the channel depleting effect of the first graded layer 104. Therefore, in regions of the channel layer 103 opposite to the non-recessed regions of the second graded layer 105, the channel electron density is higher than in regions opposite to the recess 110. Thus, in those regions immediately under the non-recessed regions of the second graded layer 105, the channel resistance is low, so that the channel resistance of the HFET can be reduced as a whole.

Although the Al mole fraction x of the first graded layer 104 is continuously changed in the layer thickness direction, decreasing linearly (at a constant rate of change) from the interface with the channel layer 103 toward the interface with the second graded layer 105 in the above embodiment, the rate of change is not necessarily required to be constant. Moreover, although the Al mole fraction x of the first graded layer 104 is 0.2 at the interface with the channel layer 103 and 0.1 at the interface with the second graded layer 105 in the above embodiment, the value of the Al mole fraction x of the first graded layer 104 is not limited to the described ones.

Moreover, although the Al mole fraction y is continuously changed in the layer thickness direction, increasing linearly (at a constant rate of change) from the interface with the first graded layer 104 toward the surface located on the side opposite from the first graded layer 104 in the above embodiment, the rate of change is not necessarily required to be constant. Moreover, although the Al mole fraction y of the second graded layer 105 is 0.1 at the interface with the first graded layer 104 and 0.35 on the surface located on the side opposite from the first graded layer 104 in the above embodiment, the value of the Al mole fraction y of the second graded layer 105 is not limited to the described ones.

That is, the Al mole fraction x is only required to be graded, or continuously change in the layer thickness direction so that the first graded layer 104 has positive fixed charge, while the Al mole fraction y is only required to continuously change in the layer thickness direction so that the second graded layer 105 has negative fixed charge. However, it is important that the value of the Al mole fraction y of the second graded layer 105 at the surface located on the side opposite from the first graded layer 104 is greater than the Al mole fraction x of the first graded layer 104 at the interface with the channel layer 103. The Al mole fraction x in the first graded layer 104 may preferably be set within a range of $0.1 \leq x \leq 0.3$, and the Al mole fraction y in the second graded layer 105 may preferably be set within a range of $0.1 \leq y \leq 0.4$. This is because too large gradients of the Al mole fractions x, y of the first and second graded layers may cause a second electronic channel to be formed in these layers.

Moreover, when the first and second graded layers 104, 105 are made of semiconductors of hexagonal crystal structure, the normally-off operation can be achieved. Also, when the first and second graded layers are of c-plane Ga face type orientation, that is, the orientation is such that the c-plane is parallel to the surface and is of the Ga face type, the normally-off operation can be achieved.

Figure 3:
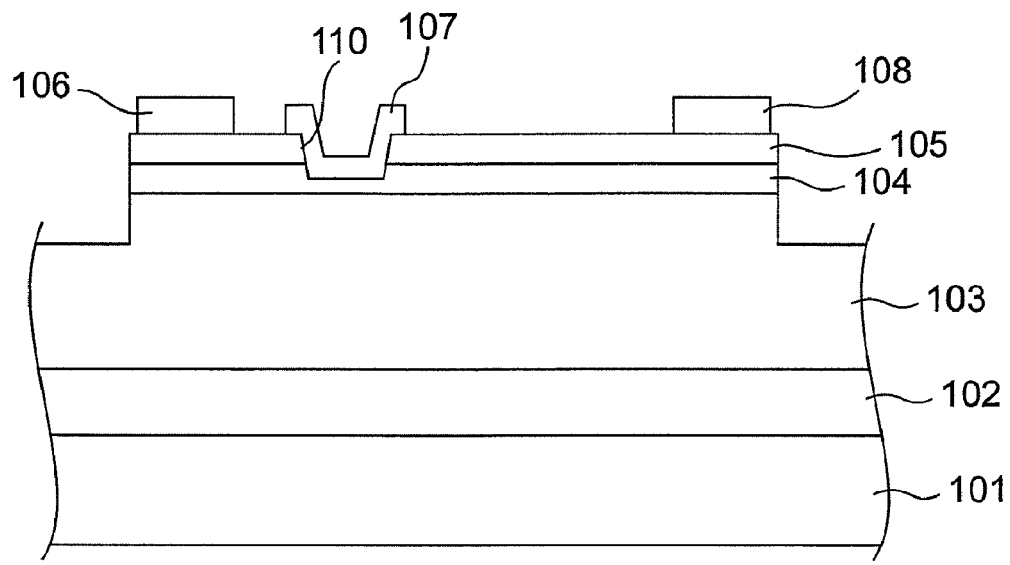
FIG. 3 is a sectional view showing a modification example of the HFET of FIG. 1.
Figure 4:
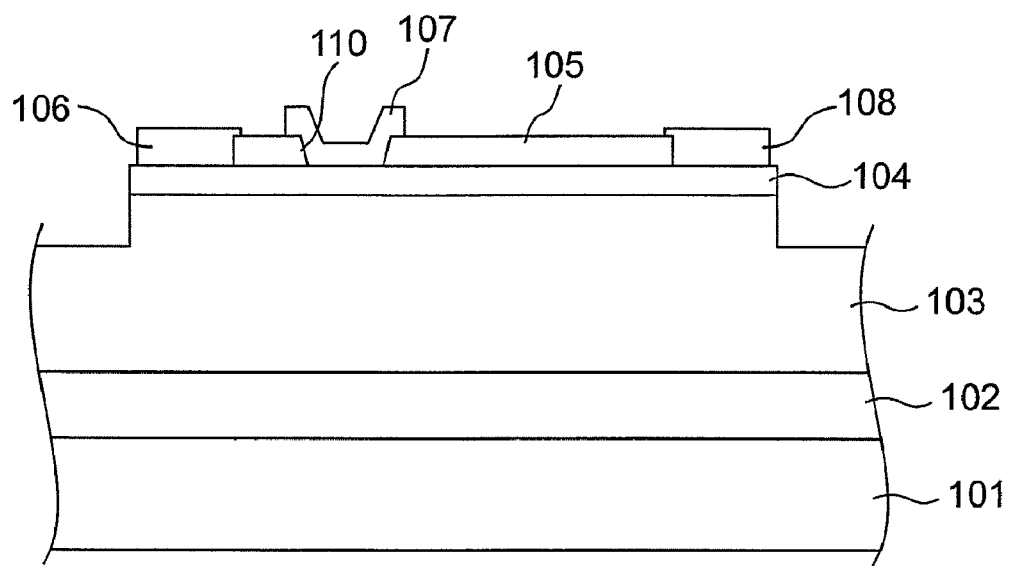
FIG. 4 is a sectional view showing a modification example of the HFET of FIG. 1.

The depth of the recess 110 is equal to the thickness of the second graded layer 105 in the above embodiment. However, the depth of the recess may be shallower or deeper than the thickness of the second graded layer 105. When the depth of the recess 110 is deeper than the thickness of the second graded layer 105, the recess 110 is to reach the inside of the first graded layer 104 through the second graded layer 105 as shown in FIG. 3. Also, although the source ohmic electrode 106 and the drain ohmic electrode 108 are formed on the second graded layer 105 in the above embodiment, it is acceptable to remove the second graded layer 105 in the regions just beneath the source ohmic electrode 106 and the drain ohmic electrode 108 and form the source ohmic electrode 106 and the drain ohmic electrode 108 directly on the first graded layer 104, as shown in FIG. 4.

In the above embodiment, the first graded layer 104 and the second graded layer 105 have a thickness of 100 Å. However, the thicknesses of these layers may be set within a range of 50 Å to 200 Å without limitation to the above value.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A field effect transistor, comprising:
   a buffer layer composed of a semiconductor formed on a substrate;
   a channel layer composed of a GaN formed on the buffer layer;
   a compositionally graded layer formed on the channel layer, the compositionally graded layer consisting of:
   a first graded layer formed directly on the channel layer and composed of $Al_xGa_{1-x}N$ whose Al mole fraction x decreases with increasing distance from the channel layer, and
   a second graded layer formed on the first graded layer and composed of $Al_yGa_{1-y}N$ whose Al mole fraction y increases with increasing distance from the first graded layer;
   a recess formed in the compositionally graded layer such that a surface of the first graded layer appears within the recess,
   a source ohmic electrode formed on the first graded layer;
   a drain ohmic electrode formed on the first or second graded layer; and
   a gate Schottky electrode formed on the surface of the first graded layer appearing within the recess.

2. A field effect transistor, comprising:
a buffer layer composed of a semiconductor formed on a substrate;
a channel layer composed of a GaN formed on the buffer layer;
a first graded layer which is formed directly on the channel layer and composed of $Al_xGa_{1-x}N$ whose composition is continuously changed in a layer thickness direction such that the first graded layer has a positive fixed charge;
a second graded layer which is formed on the first graded layer and composed of $Al_yGa_{1-y}N$ whose composition is continuously changed in a layer thickness direction such that the second graded layer has a negative fixed charge;
a source ohmic electrode formed on the first or second graded layer;
a drain ohmic electrode formed on the first or second graded layer; and
a gate Schottky electrode formed on the first or second graded layer,
wherein a recess penetrates through the second graded layer in the layer thickness direction such that a surface of the first graded layer appears within the recess, and
wherein the gate Schottky electrode covers the surface of the first graded layer.

3. A field effect transistor, comprising:
a buffer layer composed of a semiconductor formed on a substrate;
a channel layer composed of a GaN formed on the buffer layer;
a first graded layer formed directly on the channel layer and composed of $Al_xGa_{1-x}N$ whose Al mole fraction x is continuously changed in a layer thickness direction;
a second graded layer formed on the first graded layer and composed of $Al_yGa_{1-y}N$ whose Al mole fraction y is continuously changed in a layer thickness direction;
a source ohmic electrode formed on the first or second graded layer;
a drain ohmic electrode formed on the first or second graded layer; and a gate Schottky electrode formed on the first or second layer, wherein
the Al mole fraction x of the first graded layer decreases linearly at a constant rate of change from an interface of the first graded layer with the channel layer toward an interface of the first graded layer with the second graded layer,
the Al mole fraction y of the second graded layer increases linearly at a constant rate of change from an interface of the second graded layer with the first graded layer toward a surface of the second graded layer on an opposite side from the first graded layer,
a recess penetrates through the second graded layer in the layer thickness direction such that a surface of the first graded layer appears within the recess, and
the gate Schottky electrode covers the surface of the first graded layer.

4. The field effect transistor as claimed in claim 3, wherein
the Al mole fraction y of the second graded layer at the surface on the opposite side from the first graded layer has a value greater than a value of the Al mole fraction x of the first graded layer at the interface with the channel layer.

5. The field effect transistor as claimed in claim 4, wherein
the Al mole fraction x of the first graded layer is 0.2 at the interface with the channel layer and 0.1 at the interface with the second graded layer, and the Al mole fraction x linearly decreases from the interface with the channel layer toward the interface with the second graded layer, and
the Al mole fraction y of the second graded layer is 0.1 at the interface with the first graded layer and 0.35 at the surface located on the side opposite from the first graded layer, and the Al mole fraction y increases linearly from the interface with the first graded layer toward the surface located on the side opposite from the first graded layer.

6. The field effect transistor as claimed in claim 3, wherein
the field effect transistor has a threshold voltage that is equal to or greater than 0 V.

7. The field effect transistor as claimed in claim 3, wherein
the first and second graded layers have hexagonal crystal structure.

8. The field effect transistor as claimed in claim 3, wherein
the first and second graded layers have a c-plane Ga face type orientation.

* * * * *